(12) United States Patent
Yao

(10) Patent No.: US 9,269,846 B2
(45) Date of Patent: Feb. 23, 2016

(54) PHOTOTRANSISTOR CAPABLE OF DETECTING PHOTON FLUX BELOW PHOTON SHOT NOISE

(71) Applicant: Wavefront Holdings, LLC, Basking Ridge, NJ (US)

(72) Inventor: Jie Yao, Princeton, NJ (US)

(73) Assignee: WAVEFRONT HOLDINGS, LLC, Basking Ridge, NJ (US)

( * ) Notice: Subject to any disclaimer, the term of this patent is extended or adjusted under 35 U.S.C. 154(b) by 215 days.

(21) Appl. No.: 14/181,879

(22) Filed: Feb. 17, 2014

(65) Prior Publication Data

US 2015/0280046 A1 Oct. 1, 2015

Related U.S. Application Data

(60) Provisional application No. 61/773,406, filed on Mar. 6, 2013.

(51) Int. Cl.
| | |
|---|---|
| *G01J 1/42* | (2006.01) |
| *H01L 31/11* | (2006.01) |
| *G01S 17/08* | (2006.01) |
| *H01L 27/146* | (2006.01) |

(52) U.S. Cl.
CPC .............. *H01L 31/1105* (2013.01); *G01J 1/42* (2013.01); *G01S 17/08* (2013.01); *H01L 27/14625* (2013.01); *H01L 27/14681* (2013.01); *Y02E 10/50* (2013.01)

(58) Field of Classification Search
CPC  G01J 1/42; G01J 2001/442; H01L 27/14625; H01L 27/14681
USPC .......................... 250/214.1, 214 R, 214 VT; 257/290–292, 184–189; 327/514, 515
See application file for complete search history.

(56) References Cited

U.S. PATENT DOCUMENTS 6,137,123 A * 10/2000 Yang ................. H01L 31/03046
257/184

OTHER PUBLICATIONS

Tamer F. Refaat et. al., AlGaAsSb/ÕInGaAsSb phototransistors for 2-mm remote sensing applications, 1648 Optical Engineering, vol. 43 No. 7, Jul. 2004.
Arthur Rabner and Yosi Shacham-Diamand, Electron-Bombarded CMOS Image Sensor in Single Photon Imaging Mode, IEEE Sensors Journal, vol. 0, No. 0, 2010.

(Continued)

*Primary Examiner* — Que T Le
(74) *Attorney, Agent, or Firm* — Pillsbury Winthrop Shaw Pittman LLP

(57) ABSTRACT

Disclosed herein is a phototransistor (PT) comprising an emitter, a collector, a floating base, wherein the PT is configured to detect a photon flux incident on the PT and the photon flux being lower than one single photon within f, or wherein the PT is configured to detect a photon flux incident on the PT and the photon flux being below a photon shot noise of the photon flux within f, or wherein the PT is configured to detect a photon flux incident on the PT and the photon flux is $1/\sqrt{\beta}$ of a photon shot noise of the photon flux within f, or wherein the PT is capable of detecting a photon flux incident on the PT and the photon flux being below 2f, or wherein the PT is capable of detecting a photon flux incident on the PT and the photon flux being $2f/\beta$, wherein f is an electrical bandwidth of the PT and $\beta$ is a current amplification gain of the PT.

15 Claims, 4 Drawing Sheets

(56) References Cited

OTHER PUBLICATIONS

Hailin Luo, Hoi Kwan Chan, Yuchun Chang, and Y. Wang, Noise Characteristics of GaAs—AlGaAs Heterojunction Punch-Through Phototransistors, IEEE Photonics Technology Letters, vol. 13, No. 7, Jul. 2001.

Francisco H. De La Moxeda et. al., Noise in Phototransistors, IEEE Transactions OY Electron Devices, vol. ED-18, No. 6, Jun. 1971.

Luo Hailin, Punchthrough phototransistors, Thesis submitted to Hong Kong University of Science and Technology, Jan. 2002.

JS Dunn et. al., Foundation of rf CMOS and SiGe BiCMOS technologies, IBM J. Res. & Dev. vol. 47 No. 2/3 Mar./May 2003.

Jin Tang et. al., Modeling and Characterization of SiGe HBT Low-Frequency Noise Figures-of-Merit for RFIC Applications, IEEE Transactions on Microwave Theory and Techniques, vol. 50, No. 11, Nov. 2002.

Guofu Niu et. al., Noise Modeling and SiGe Profile Design Tradeoffs for RF Applications, IEEE Transactions on Electron Devices, vol. 47, No. 11, Nov. 2000.

Guofu Niu et. al., A Unified Approach to RF and Microwave Noise Parameter Modeling in Bipolar Transistors, IEEE Transactions on Electron Devices, vol. 48, No. 11, Nov. 2001.

Guofu Niu et. al., Transistor Noise in SiGe HBT RF Technology, IEEE Journal of Solid-State Circuits, vol. 36, No. 9, Sep. 2001.

Guofu Niu et. al., Noise Parameter Optimization of UHV/CVD SiGe HBT's for RF and Microwave Applications, IEEE Transactions on Electron Devices, vol. 46, No. 8, Aug. 1999.

Hailin Luo et. al., Ultrasensitive Si phototransistors with a punchthrough base, Applied Physics Letters vol. 79, No. 6 Aug. 6, 2001.

* cited by examiner

PHOTOTRANSISTOR CAPABLE OF DETECTING PHOTON FLUX BELOW PHOTON SHOT NOISE

STATEMENT REGARDING FEDERALLY SPONSORED RESEARCH OR DEVELOPMENT

This invention was made in part with Government support under Contract FA9453-13-M-0056 awarded by the Department of the Air Force and under Contracts M67854-11-C-6544 and M67854-14-C-6530 awarded by the Department of the Navy. The Government has certain rights in the invention.

BACKGROUND

With its high sensitivity, low amplification noise, high speed and high gain stability and uniformity from device to device, the phototransistor is a promising candidate for low light level sensing applications.

Phototransistors may be integrated into an image sensor, which is a device that converts an optical image into an electronic signal. It is used mostly in digital cameras, camera modules and other imaging devices.

SUMMARY

Disclosed herein is a phototransistor (PT) comprising an emitter, a collector and a floating base, wherein the PT is configured to detect a photon flux incident on the PT and the photon flux being lower than one single photon within an electrical bandwidth of the PT.

Disclosed herein is a phototransistor (PT) comprising an emitter, a collector and a floating base, wherein the PT is configured to detect a photon flux incident on the PT and the photon flux being below a photon shot noise of the photon flux within an electrical bandwidth of the PT.

Disclosed herein is a phototransistor (PT) comprising an emitter, a collector and a floating base, wherein the PT is configured to detect a photon flux incident on the PT and the photon flux being $1/\sqrt{\beta}$ of a photon shot noise of the photon flux within an electrical bandwidth of the PT and $\beta$ is an amplification gain of the PT.

Disclosed herein is a phototransistor (PT) comprising an emitter, a collector and a floating base, wherein the PT is capable to detect a photon flux incident on the PT and the photon flux being below 2f, wherein f is an electrical bandwidth of the PT.

Disclosed herein is a phototransistor (PT) comprising an emitter, a collector and a floating base, wherein the PT is capable to detect a photon flux incident on the PT and the photon flux being $2f/\beta$, wherein f is an electrical bandwidth of the PT and $\beta$ is an amplification gain of the PT.

According to an embodiment, the floating base is not in direct electrical contact with an electrode, which is typically polysilicon or metal.

The emitter junction, also called the emitter-base junction, or the E-B junction, is the p-n or p-i-n junction formed between the emitter and the floating base, and the collector junction, also called the base-collector junction, or the B-C junction, is the p-n or p-i-n junction formed between the collector and the floating base. Here, a junction refers to the p-n or p-i-n junction formed between an n-type doped semiconductor and a p-type doped semiconductor.

According to an embodiment, a junction between the emitter and the base, the base and a junction between the collector and the base are in direct physical contact only with and completely encapsulated only by the emitter, a dielectric, and the collector. The collector may include a sub-collector.

According to an embodiment, the base floats and is not in direct electrical contact with an electrode. Such a PT is referred to as a "two-terminal" PT. A "two-terminal" PT does not mean that the PT does not have a base. Rather it means a PT with a floating base. In contrast, if the base of a PT is in direct electrical contact with an electrode, the base is not floating, and such a PT is referred to as a "three-terminal" PT.

Disclosed herein is a method of detecting a photon signal, the method comprising receiving a photon flux with the PT described herein, under a non-zero bias voltage and reading an electrical current at the emitter or the collector.

According to an embodiment, an electrical voltage of the floating base is determined by a magnitude of a photon flux incident on the PT.

According to an embodiment, the PT is a hetero-junction phototransistor (HPT).

According to an embodiment, the floating base comprises SiGe or InGaAs.

According to an embodiment, the PT has a zero recovery dead time.

According to an embodiment, PT has an electrical bandwidth of at least 10 kHz.

According to an embodiment, PT has an electrical bandwidth of at least 10 MHz.

According to an embodiment, the PT is configured to function at room temperature.

Disclosed herein is an apparatus, comprising an optical system having an image plane or a focal plane; an array of PTs described herein positioned on the image plane or focal plane.

Disclosed herein is a method of detecting a photon signal, the method comprising receiving a photon flux with the PT described herein under a non-zero bias voltage; reading an electrical current at the emitter, at the collector or between the collector and the emitter.

Disclosed herein is a method of detecting an object, the method comprising directing light from the object onto the PT described above; detecting a current at the collector of the PT, at the emitter of the PT, or between the collector and the emitter of the PT; determining a photon flux of the light directed onto the PT; wherein the photon flux of the light is lower than one single photon, lower than its photon shot noise, or below 2f, within an electrical bandwidth f of the PT, wherein $\beta$ is an amplification gain of the PT.

Disclosed herein is an Adaptive Optics (AO) system, comprising the PT described above.

Disclosed herein is a Light Detection And Ranging (LIDAR) system, comprising the PT described above.

DETAILED DESCRIPTION

Figure 1:
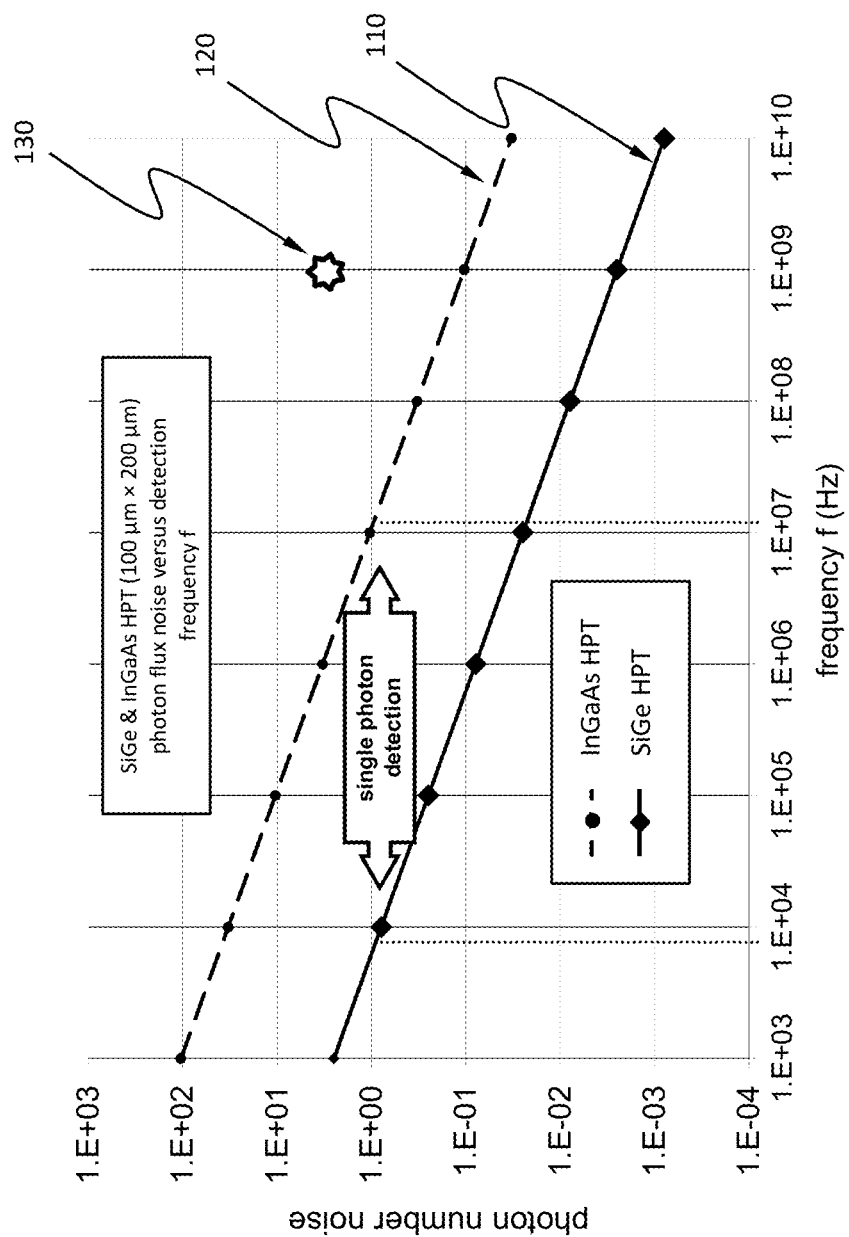
FIG. 1 shows exemplary room-temperature photon number noises as functions of detection frequency in two exemplary PTs.

U.S. Pat. No. 7,067,853 titled "Image intensifier using high-sensitivity high-resolution photodetector array", U.S.

Pat. No. 8,253,215 titled "Mesa heterojunction phototransistor and method for making same", U.S. Pat. No. 8,314,446 titled "Photo-detector array, semiconductor image intensifier and methods of making and using the same", U.S. Pat. No. 8,354,324 titled "Mesa heterojunction phototransistor and method for making same", U.S. Provisional Patent Application Ser. No. 61/442,901 titled "Phototransistor for the Detection of Photon Flux Below Its Photon Shot Noise", and U.S. Provisional Patent Application Ser. No. 61/773,406 titled "Phototransistor for the Detection of Photon Flux Below Its Photon Shot Noise" are each hereby incorporated by reference in its entirety.

Although the term PT is used in this disclosure, the apparatuses and methods disclosed herein are applicable to both homo-junction phototransistors and hetero-junction phototransistors (HPT). Therefore, the term "PT" should be interpreted to encompass both homo-junction phototransistors and hetero-junction phototransistors.

Quantitatively, the noise of a PT is dominated by its white shot noise and resembles the standard expression for the current noise spectral density of a bipolar junction transistor (BJT):

$$i_n = \sqrt{2e(I_{dark} + I_{photo})} \quad \text{(Eq. 1)},$$

where Idark is the current flowing through either or both of the two terminals (emitter and collector) of the PT when the PT is in dark, and Iphoto is the additional current flowing through either or both of the two terminals (emitter and collector) of the PT when the PT is lit (i.e., photo current), when the base of the PT is floating (i.e., whose base electrical potential is modulated by the incident photon flux). $i_n$ is spectrally white at least up to the cutoff frequency of the PT.

Unlike an avalanche photodetector (APD), a PT exhibits absolutely zero excess noise, when the PT is operated at its normal operating bias voltage way below breakdown.

Unlike other photodetectors, which detect the positions of photons by amplified photonic events (e.g., by avalanche amplification), a PT detects a photon flux. According to Eq. 1, the noise equivalent power is NEP=$i_n$/R, where R is the responsivity of the PT. NEP is the photon noise power that, when applied to the input of the noiseless detector, generates the same output noise as the actual detector does. Responsivity measures the electrical output per optical input of the PT. In the context of PT, responsivity may be expressed as R=$I_{photo}/P_{photon}$=β(eλ/hc), when β>>1 and the quantum efficiency is one, where $P_{photon}$ is the power of the light incident on the PT, β is the current amplification gain of the PT and λ is the wavelength of the light incident on the PT. Consequently, the NEP of the PT is lower than the white photon shot noise by a factor of $\sqrt{\beta}$, which indicates that the PT is capable of detecting photon flux at $1/\sqrt{\beta}$ of the white shot noise of light incident on the PT. In comparison, an APD is limited by the white photon shot noise (i.e., incident light below the white photon shot noise cannot be effectively detected by an APD) because the APD measures photon position, not photon flux. Numerically, even at a modest current amplification gain of β=1,000, the NEP of the PT is only about 1/30 of the current noise of an ideal APD with zero excess noise and the same dark current, photo current and gain. β may be greater than 1,000, thus the NEP of the PT may be below approximately 1/30 of the current noise of an ideal APD.

The photon flux detection at $1/\sqrt{\beta}$ of the white shot noise level of the photon flux incident on the PT is consistent with the Ebers-Moll model for bipolar transistors. The current through the emitter and collector of the PT is determined by the voltage of the floating base of the PT, which is determined not by the arrival of individual photons but by the magnitude of photo current, which in turn is determined by photon flux or photon momentum but not by the positions of individual photons.

Although photons have fixed momentum only in the form of a quantum mechanical plane wave, photons detected by a semiconductor photodetector can be quite accurately approximated as a plane wave. This is because photons travel much farther than the thickness of the photon absorption layer in the semiconductor photodetector, during the detection time of the semiconductor photodetector. For example, the photon absorption layer in a semiconductor photodetector such as a PT is typically about 1 micron thick. It takes a photon about $10^{-14}$ second to traverse the photon absorption layer. Therefore, when the photodetector operates at GHz or lower frequency, the photon travels at least $10^5$ times farther than the thickness of the absorption layer.

The photon flux detection at $1/\sqrt{\beta}$ of the white shot noise level of the photon flux incident on the PT allows sub-photon detection and detecting photon flux below photon shot noise. According to $$i_{photon\ number} = \frac{\sqrt{2eI_{dark}f}}{f \cdot e \cdot \beta}, \quad \text{(Eq. 2)}$$

one can operate the PT for sub-photon detection continuously with zero recovery dead time and at room temperature without cooling, and achieve sub-photon detection on a 100 μm×200 μm PT with at least 10 kHz electrical bandwidth in SiGe and with at least 10 MHz electrical bandwidth in InGaAs, in accordance with FIG. 1.

In terms of photon flux φ defined as the number of photons incident on the photon detector per unit time, the PT can be used to detect photon flux φ below the photon shot noise level:

$$2f/\beta \leq \Phi < 2f \quad \text{(Eq. 3)}.$$

f is the electrical bandwidth (the frequency at which the alternating current (AC) electrical output power of the PT falls to 50% of the electrical output power of the PT at DC) of the PT-based photon flux sensor including the PT and its follow-on amplifier and readout circuitry (e.g., CMOS readout); β is the PT current amplification gain. f is typically, but not always, limited by the follow-on amplifier and readout circuit.

Besides detecting photon flux equal to or higher than its photon shot noise, the PT can be used to detect photon flux below the photon shot noise of the photon flux incident on the PT.

FIG. 1 shows exemplary room-temperature photon number noise 110 as a function of detection frequency in a PT having a base comprising SiGe (also known as silicon-germanium, which is an alloy of Si and Ge with a composition of $Si_{1-x}Ge_x$), and exemplary room-temperature photon number noise 120 as a function of detection frequency in a PT having a base comprising InGaAs. A typical data point 130 of a cooled 25 μm InGaAs Geiger APD is included in FIG. 1 for comparison. Both PTs have lower noise at the same detection frequency at room temperature than the cooled APD. At frequencies where the photon number noise is smaller than 1, the PT can detect single photons.

Figure 2:
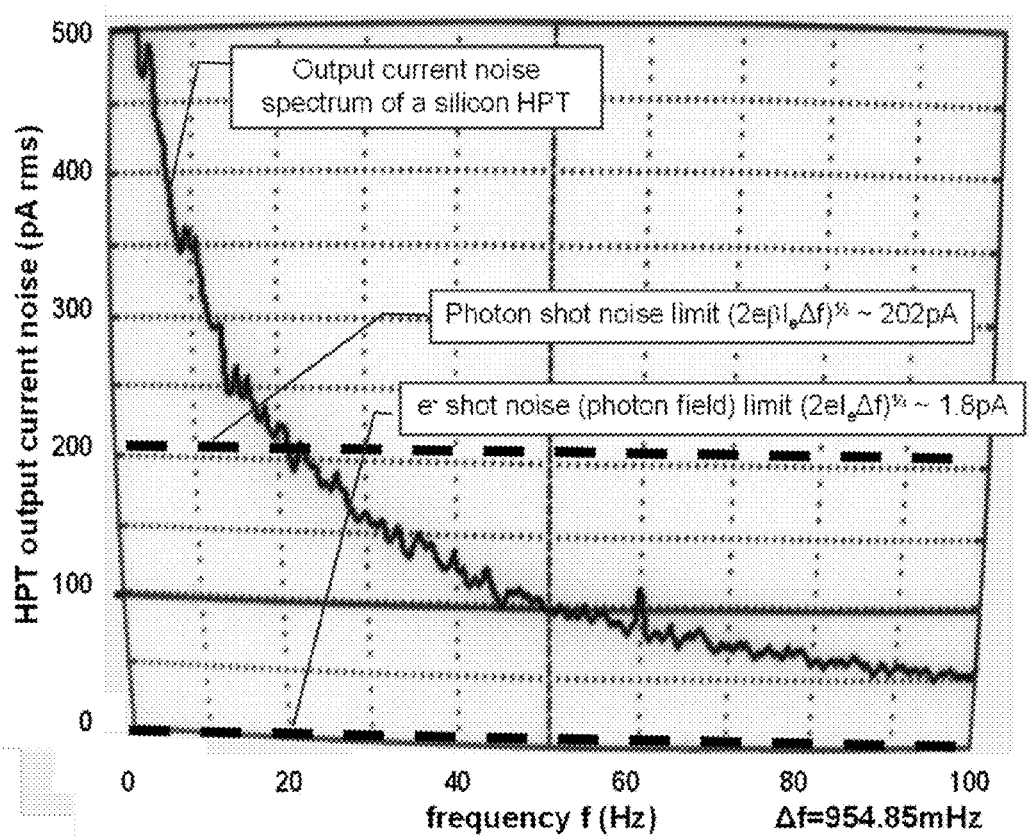
FIG. 2 shows silicon HPT output current noise spectrum.

FIG. 2 shows output current noise spectrum of a silicon HPT, as an example of the PT described herein. The measured silicon HPT output current noise is plotted against frequency at 954.85 mHz noise bandwidth interval in FIG. 2, and is clearly below the photon shot noise level within the HPT electrical bandwidth.

Figure 3:
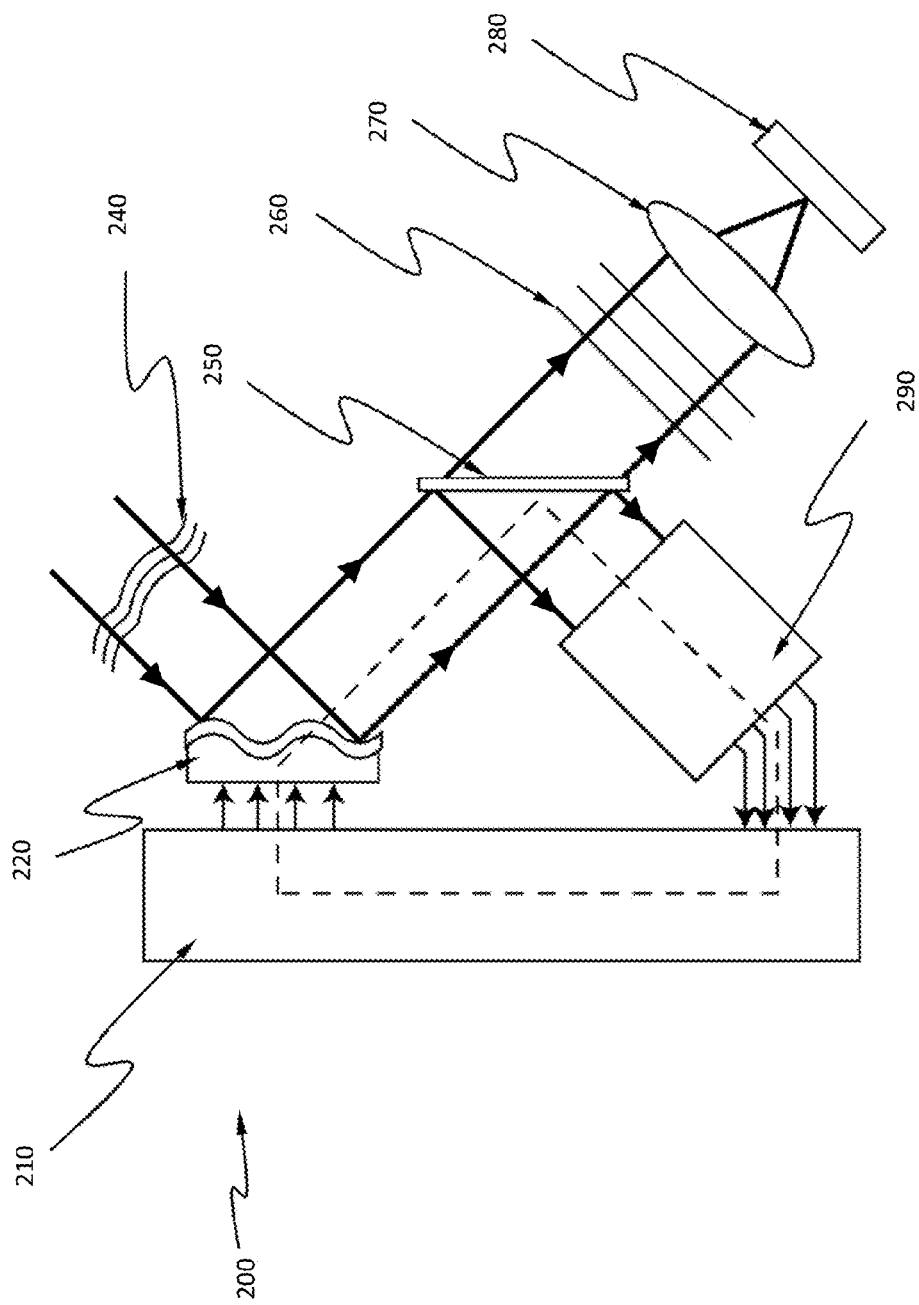
FIG. 3 shows a schematic diagram of an exemplary adaptive optical (AO) system including a PT disclosed herein, according to an embodiment.

FIG. 3 shows a schematic diagram of an exemplary Adaptive Optics (AO) system 200 including an imaging array 280, according to an embodiment. Adaptive optics is a technology used to improve the performance of optical systems by reducing the effect of wave front distortions. Applications of AO include astronomical telescopes and laser communication systems (to remove the effects of atmospheric distortion), and include microscopy, optical fabrication, and retinal imaging systems (to reduce optical aberrations). Adaptive optics works by measuring the distortions in a wave front and compensating for them with a device that corrects those errors such as a deformable mirror or a liquid crystal array. Incident light on the AO system 200 may have a distorted wave front 240, which may adversely affect imaging quality. Incident light reflects on a deformable mirror 220, which corrects the wave front of the incident light. Incident light with corrected wave front 260 then is split by a beam splitter 250 into a wave front sensor 290, and into the imaging array 280 through a lens assembly 270. The wave front sensor 290 measures the corrected wave front of the incident beam downstream and sends the measurement of the corrected wave front into a control system 210. The control system 210 deforms the deformable mirror 220 based on the measurement of the corrected wave front to partially or completely cancel the distortion of the incident light. The distorted wave front 240 may change over time. For example, when the AO system is used to image an object in the atmosphere, atmospheric turbulence may be fast-changing. The disclosed PT has low noise and high signal-to-noise ratio, and thus allows short integration time and high detection frequency (e.g., 1000 Hz or more). The disclosed PT array may be used in either the imaging array 280 or the wave front sensor 290 or both. The AO system 200 therefore is capable of compensating for fast-changing distortion in the incident light.

Figure 4:
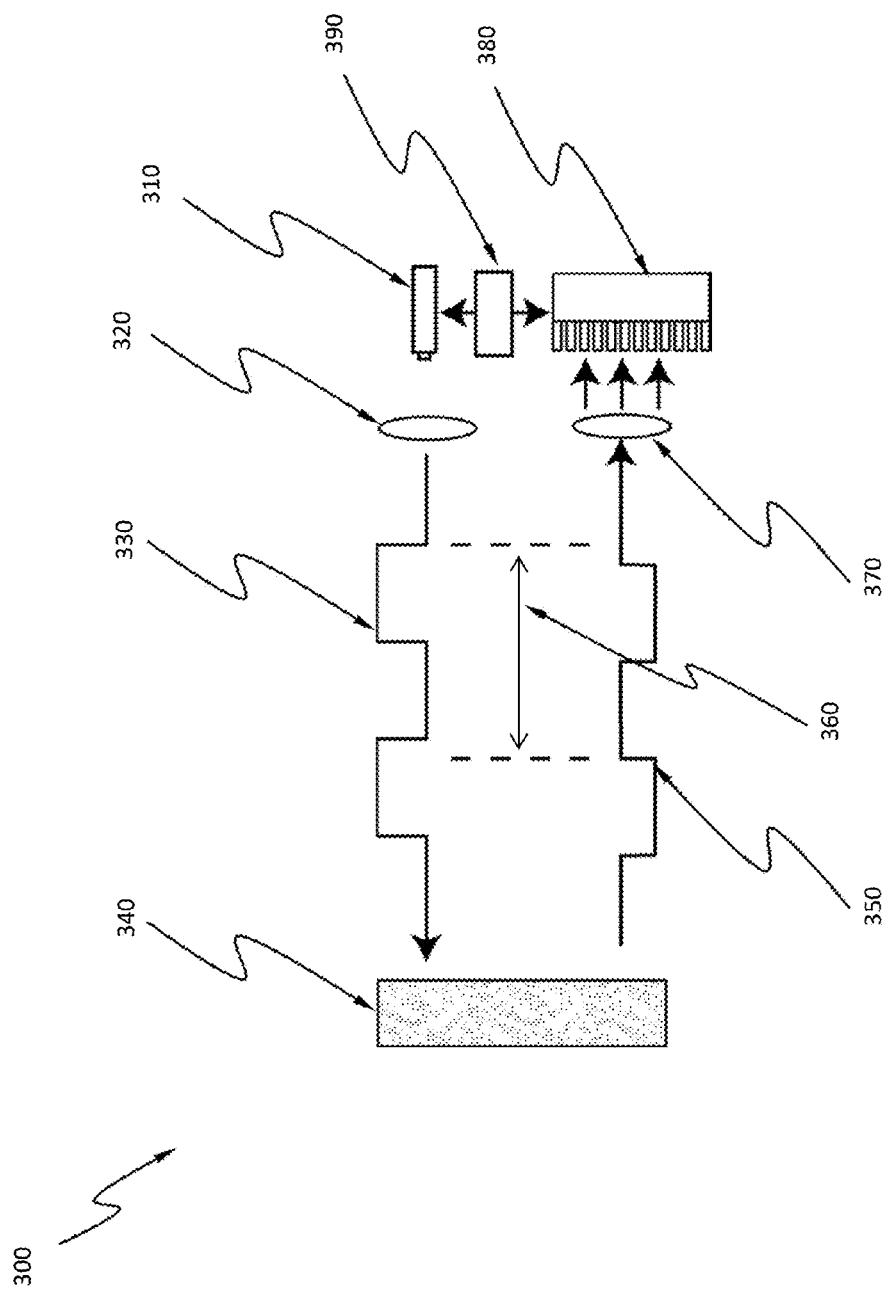
FIG. 4 shows a schematic diagram of a Light Detection And Ranging (LIDAR) system including a PT disclosed herein, according to an embodiment.

FIG. 4 shows a schematic diagram of a Light Detection And Ranging (LIDAR) system 300, according to an embodiment, including a PT or PT array 380. LIDAR may use ultraviolet, visible, or infrared light to image objects and can be used to detect a wide range of targets, including metallic objects, non-metallic objects, rocks, rain, chemical compounds, aerosols, clouds and even single molecules. LIDAR may be used in atmospheric research and meteorology. For example, downward-looking LIDAR fitted to aircraft and satellites may be used for surveying and mapping. LIDAR may be used in robotics, such as unmanned vehicles and extra-terrestrial landing probes. LIDAR may include a scanning or flash light beam such as laser, a photodetector configured to detect the light beam scattered by an object (by any suitable mechanism such as Rayleigh scattering, Mie scattering, Raman scattering, and fluorescence), and a data processing system. A narrower light beam usually leads to higher spatial resolution. The photodetector may detect the amplitude, phase, polarization, wavelength, modulation, or any other characteristics of the scattered light beam, or a combination of these characteristics.

The LIDAR system 300 includes a light source 310, an optical system 320 (including any suitable optical components, refractive, reflective or both). A light from the light source 310 is projected by the optical system 320 as a scanning or flash light beam 330. The light beam 330 may be modulated or unmodulated, pulsed or continuous. When the light beam 330 hits an object 340, a scattered light 350 is scattered back to the LIDAR system 300. The LIDAR system 300 includes one or more optical components 370 that direct the scattered light 350 to the PT or PT array 380. The LIDAR system 300 may include a control system 390 configured to control the light source 310, the optical system 320 and 370 and/or the PT or PT array 380. The control system 390 may be also configured to process data collected by the PT or PT array 380. For example, the PT or PT array 380 may measure a phase difference 360 between the light beam 330 and the scattered light 350, from which the control system 390 may calculate the distance of the object 340.

The PT disclosed herein may be used in a method of detecting an object under a low light condition such as at night and in an enclosed structure, according to an embodiment. The method may include directing light from the object onto the PT. The light may be scattered, reflected or emitted by the object. The method may further include detecting a current at a collector of the PT, at an emitter of the PT, or between the collector and the emitter of the PT. The method may further include determining a photon flux of the light directed onto the PT, based on the current. The method may further include constructing an image of the object. On at least one PT, the photon flux may be below a photon shot noise of the light directed onto the PT.

An imaging apparatus, according to an embodiment, may include an optical system having an image plane, an image sensor comprising an array of PTs, wherein the image sensor is positioned on the image plane and configured to sense an image. The PTs in the image sensor may be configured to detect a photon flux incident on the PTs when the photon flux on at least one PT is below a photon shot noise of the photon flux.

An apparatus, according to an embodiment, may include an optical system having a focal plane, an array of PTs, wherein the array is positioned on the focal plane. The PTs in the array may be configured to detect a photon flux incident on the PTs when the photon flux incident on at least one PT is below one single photon, below a photon shot noise of the photon flux, or below 2f.

As used herein, that a measurement system "detects" a signal means the measurement system measuring a signal greater than or equal to the root-mean-square (r.m.s.) noise of the measurement system, i.e., the measurement system measuring a signal with signal-to-noise ratio (S/N) greater than or equal to 1. Here, the signal is defined as the deterministic output of the measurement system, while the noise is defined as the random fluctuations in the output of the measurement system. If the measured signal is lower than the r.m.s. noise of the measurement system, the measurement system cannot detect the signal. Therefore, according to these definitions, a measurement system can detect a signal if and only if the signal is no smaller than the r.m.s. noise of the measurement system.

In relation to the claims, it is intended that when words such as "a," "an," "at least one," or "at least one portion" are used to preface a feature there is no intention to limit the claim to only one such feature unless specifically stated to the contrary in the claim.

The descriptions above are intended to be illustrative, not limiting. Those of ordinary skill in the art may recognize that many modifications and variations of the above may be implemented without departing from the spirit or scope of the following claims. Thus, it is intended that the following claims cover the modifications and variations provided they come within the scope of the appended claims and their equivalents.

What is claimed is:

1. A phototransistor (PT) comprising an emitter, a collector and a floating base, wherein the PT is configured to detect a photon flux incident on the PT and the photon flux being lower than one single photon within an electrical bandwidth of the PT.

2. A phototransistor (PT) comprising an emitter, a collector and a floating base, wherein the PT is configured to detect a photon flux incident on the PT and the photon flux being below a photon shot noise of the photon flux within an electrical bandwidth of the PT.

3. The PT of claim 2, wherein the photon flux is $1/\sqrt{\beta}$ of a photon shot noise of the photon flux within an electrical bandwidth of the PT, wherein $\beta$ is a current amplification gain of the PT.

4. A phototransistor (PT) comprising an emitter, a collector and a floating base, wherein the PT is configured to detect a photon flux incident on the PT and the photon flux being below 2f, wherein f is an electrical bandwidth of the PT.

5. The PT of claim 4, wherein the photon flux is $2f/\beta$, wherein f is an electrical bandwidth of the PT and $\beta$ is a current amplification gain of the PT.

6. The PT of claim 1, wherein a junction between the emitter and the floating base, the base and a junction between the collector and the floating base are in direct physical contact only with and completely encapsulated only by the emitter, a dielectric, and the collector.

7. The PT of claim 2, wherein a junction between the emitter and the floating base, the base and a junction between the collector and the floating base are in direct physical contact only with and completely encapsulated only by the emitter, a dielectric, and the collector.

8. The PT of claim 4, wherein a junction between the emitter and the floating base, the base and a junction between the collector and the floating base are in direct physical contact only with and completely encapsulated only by the emitter, a dielectric, and the collector.

9. A method of detecting a photon signal, the method comprising receiving a photon flux with the PT of claim 1 under a non-zero bias voltage and reading an electrical current at the emitter or the collector.

10. A method of detecting a photon signal, the method comprising receiving a photon flux with the PT of claim 2 under a non-zero bias voltage and reading an electrical current at the emitter or the collector.

11. A method of detecting a photon signal, the method comprising receiving a photon flux with the PT of claim 4 under a non-zero bias voltage and reading an electrical current at the emitter or the collector.

12. An apparatus, comprising
 an optical system having an image plane or a focal plane;
 an array of PTs of claim 2 positioned on the image plane or focal plane.

13. A method of detecting an object, the method comprising
 directing light from the object onto the PT of claim 2;
 detecting a current at the collector of the PT, at the emitter of the PT, or between the collector and the emitter of the PT;
 determining a photon flux of the light directed onto the PT;
 wherein the photon flux of the light is lower than a photon shot noise of the photon flux within an electrical bandwidth of the PT.

14. An Adaptive Optics (AO) system, comprising the PT of claim 2.

15. A Light Detection And Ranging (LIDAR) system, comprising the PT of claim 2.

* * * * *